United States Patent [19]

Davies, Jr.

[11] 4,075,464

[45] Feb. 21, 1978

[54] INCREMENTER/DECREMENTER CIRCUIT

[75] Inventor: Thomas J. Davies, Jr., San Jose, Calif.

[73] Assignee: Fairchild Camera and Instrument Corporation, Mountain View, Calif.

[21] Appl. No.: 792,617

[22] Filed: May 2, 1977

[51] Int. Cl.$^2$ .................. G06M 3/14; H03K 23/30
[52] U.S. Cl. .................. 235/92 EV; 235/92 LG; 235/92 GT; 235/92 SH; 235/92 R; 307/222 C
[58] Field of Search ....... 235/92 EV, 92 LG, 92 GT, 235/92 SH; 307/222 R, 222 C; 328/44

[56] References Cited

U.S. PATENT DOCUMENTS

| | | | |
|---|---|---|---|
| 3,654,441 | 4/1972 | Bharali | 235/92 EV |
| 3,675,044 | 7/1972 | Vogelsberg | 307/222 R |
| 3,940,596 | 2/1976 | Paddock | 235/92 LG |

*Primary Examiner*—Joseph M. Thesz
*Attorney, Agent, or Firm*—Alan H. MacPherson; Henry K. Woodward; Robert C. Colwell

[57] ABSTRACT

A digital circuit for sensing the signal on a data bus, selectively incrementing or decrementing the binary signal and reapplying it to the bus. The circuitry includes a binary counter comprising a temporary storage cell for each bus conductor. The output of each cell controls the conduction through an adjacent portion of a pre-charged conductor which is periodically discharged at the least significant digit cell and which, when charged adjacent a higher order cell, will inhibit the toggling of that cell. All bus lines are pre-charged to a binary "1" at a particular instant followed by the discharge to "0" of those lines whose respective cells contain a binary "0".

7 Claims, 2 Drawing Figures

INCREMENTER/DECREMENTER CIRCUIT

This invention relates to binary circuitry and particularly to a novel signal incrementer/decrementer that receives its input from a multi-line digital data bus, selectively increments or decrements the number at high speed, and reapplies the new number to the bus.

BRIEF DESCRIPTION OF THE INVENTION

Briefly described, the circuitry of the invention includes a plurality of identical temporary storage cells, one cell for each bus conductor. Each cell contains a temporary storage which, at predetermined times, is loaded with the binary number from its bus and recirculated through the cell and to an output which controls the conductivity of a portion of a pre-charged conductor. The conductor is discharged at predetermined times at the least significant digit cell and, if discharge of a portion of the conductor adjacent a higher order cell is prevented, the remaining charge will inhibit the toggling of that cell. Thus, the toggling of any cell is dependent upon the particular state of all lower order cells and the conductivity of the discharge line to the least significant digit cell.

During each of the periods that the multi-cell counter increments or decrements as directed, and after the binary number appearing on the bus has been transferred to the cells, each conductor of the bus is charged to contain a binary "1" and is immediately followed by the discharge of only those lines in the bus whose respective cells contain a binary "0". Therefore, at the end of each cycle of operation of the circuitry, the new number may be entered into the bus.

DESCRIPTION OF THE DRAWINGS

In the drawings which illustrate a preferred embodiment of the invention.

DETAILED DESCRIPTION OF THE PREFERRED EMBODIMENT

Figure 1:
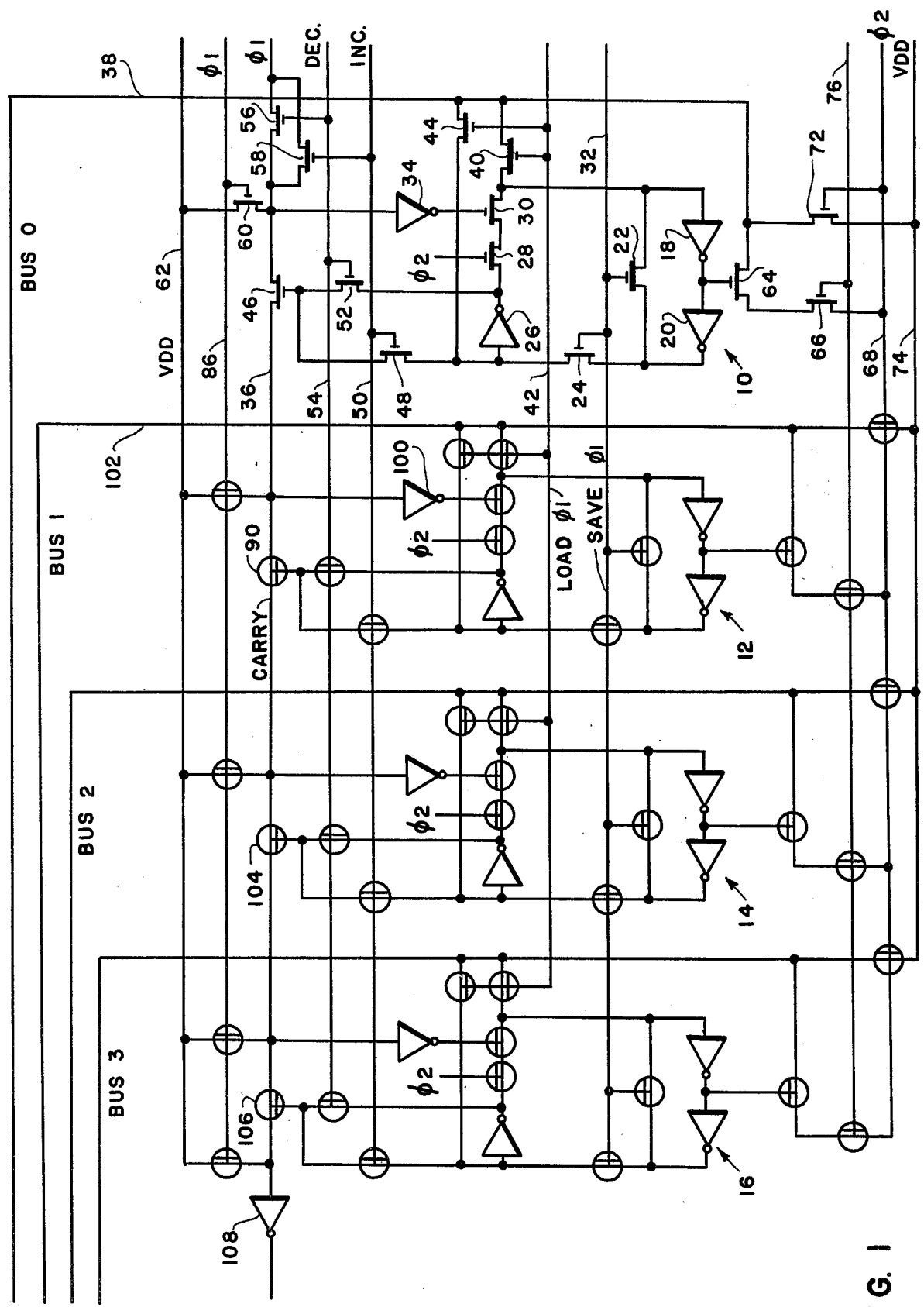
FIG. 1 is a detailed block diagram illustrating the circuitry of the invention.

In the embodiment illustrated in FIG. 1, a four-cell incrementer/decrementer circuit is coupled to a four-line bus. It will, of course, be understood that the circuitry may be easily and readily expanded to accommodate any number of bus conductors and that the four-line bus described and shown is for illustrative purposes. In FIG. 1, the bus-0 is associated with the least significant digit cell 10; the next more significant digit cell 12 receives the signal from and reapplies the signal to bus-1; cell 14 accommodates bus-2; and cell 16 controls bus-3. Each of the cells 10, 12, 14 and 16 are identical in every respect so that it will only be necessary to explain cell 10 in detail.

The cell 10 contains a memory storage loop comprising an inverter 18 in series with a second identical inverter 20, the output of which is fed back into the input of inverter 18 through an FET switch 22. FET 22 and all other FETs in the circuitry are preferably N-channel MOSFETs normally operating at cut-off and rendered conductive by a positive voltage on the gate element but may, if desired, be the slower operating P-channel MOSFETS. Thus, current flow through the circuit, including the inverters 18 and 20, can only occur when the gate element of the FET 22 is at a positive value.

The output terminal of the inverter 20 is coupled through an FET 24 to the input of an inverter 26, the output of which is connected through series FETs 28 and 30 to the input of the inverter 18. The gating elements of FETs 22 and 24 are coupled to SAVE conductor 32, the FET 28 is rendered conductive by the application of a positive $\phi 2$ signal which will be subsequently described, and the gating element of FET 30 is coupled to the output of an inverter 34, the input of which is coupled to CARRY conductor 36.

The least significant digit cell 10 is coupled to receive the binary value carried by the least significant digit bus 38. Therefore, bus 38 is coupled to one input node of the cell 10 through FET 40, the gate element of which is connected to a LOAD conductor 42. Bus 38 is also connected to the input terminal of the inverter 26 through FET 44, the gate element of which is also connected to the LOAD conductor 42. The input terminal of inverter 26 is also coupled to the gate element of FET 46 through FET 48, the gate element of which is connected to the increment control conductor 50; and the output of inverter 26 is coupled to the gate element of FET 46 through an FET 52, the gate element of which is connected to the decrement control conductor 54. The FET 46 is one of several switches in series along the CARRY conductor 36.

Conductor 36 is formed of several portions, one portion adjacent each of the cells 10–16. The portion of conductor 36 adjacent the cell 10 is periodically discharged by the negative swing of a $\phi 1$ oscillator output signal, as will be sugsequently described, and is switched to discharge into the low $\phi 1$ current sink by switching on FETs 46 or 58. The gate element of FET 56 is coupled to the decrement control conductor 54 and the gate element of FET 58 is coupled to the increment control conductor 50. The portion of conductor 36 between the FET switch 46 and FETs 56 and 58 is periodically charged by an FET 60 which is connected between the conductor 36 and a conductor 62 which carries a positive D.C. potential.

Bus 38 is coupled through FET 64 and FET 66 to a $\phi 2$ connected conductor 68. The bus 38 is also connected through FET 72 to a conductor 74 which is coupled to a source of positive D.C. potential. The gate element of FET 64 is coupled to the output of the inverter 18 in the cell 10 and is rendered conductive by a positive signal therefrom. The gate elements of FET 66 are connected to an output control conductor 76 which, when reloading from the cell 10 to the bus 38 is desired, is provided a positive signal during time T2. The gate element of FET 72 is connected to the $\phi 2$ conductor 68.

Figure 2:
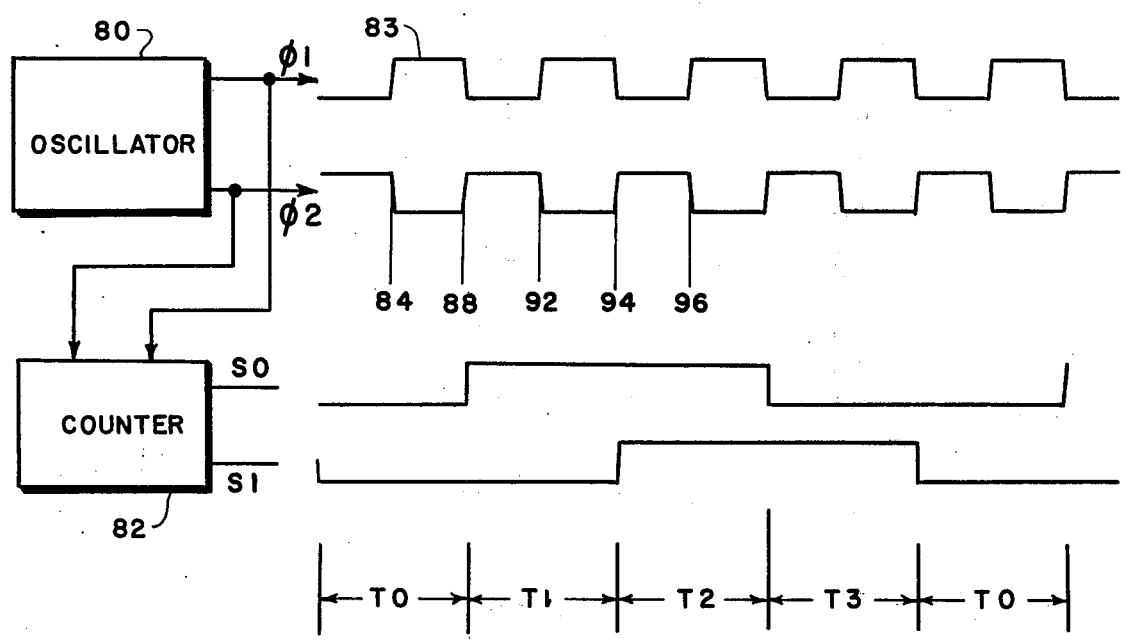
FIG. 2 is a diagram illustrating the timing waveforms for the control of the circuitry of FIG. 1.

Turning now to a description of the waveforms of FIG. 2, an oscillator 80 associated with the circuitry produces a two-phase output, $\phi 1$ and $\phi 2$, at a constant frequency of between 100 and 200 KHz. The output of the oscillator 80 is also applied to the input of a Johnson counter 82 which produces a Johnson code S0 and S1. As noted in FIG. 2, state time T0 occurs when both S0 and S1 are in their low states; T1 occurs when S1 is low and S0 is high; T2 occurs when both S1 and S0 are high; and state time T3 occurs when S0 is low and S1 is high. Certain elements and and conductors are directly coupled to the output of oscillator 80 and the Johnson counter 82 and, in the description of the operation of the circuitry of FIG. 1, reference will often be made to the various state times and phases.

OPERATION OF THE CIRCUITRY

LOAD conductor 42 is logically combined with $\phi 1$ to receive a positive pulse from $\phi 1$ during state time T0 as indicated by the reference numeral 83 of FIG. 2. At the beginning of the $\phi 1$ pulse, as indicated by the numeral 84, FETs 40 and 44 become conductive to transmit the binary state that is present on the bus 38 into the cell 10. The data bit transmitted by FET 40 passes through inverters 18 and 20 but not through FET 24, which is rendered conductive by a positive $\phi 1$ signal occurring during state times T1, T2, and T3. During conduction of FET 40, FET 44 is also conductive to transmit the binary bit from bus 38 to the input of inverter 26, the inverted output from which is being held from further transmission through the cell by the non-conductive FET 28. This condition continues through the remainder of state time T0.

During each high state of a $\phi 1$ signal, the control conductor 86, which is connected to the $\phi 1$ output of oscillator 80, receives a similar high signal which turns on FET 60 to pass the positive D.C. voltage on conductor 62 to the CARRY conductor 36. Thus, the portion of conductor 36 between FET 46 and FETs and 58 becomes charged with a positive voltage which, when inverted by inverter 34, applies a zero inhibiting voltage to the FET 30. Therefore, FET 30 will remain off while the corresponding portion of line 36 contains a positive charge.

The CARRY conductor 36, charged during each $\phi 1$, may be discharged through FETs 56 and 58 into the low value of a $\phi 1$ signal. Thus, $\phi 1$ acts as a current sink when it switches to its low state and when FETs 56 or 58 are turned on by an increment or decrement signal during state time T1 as indicated by reference numeral 88 in FIG. 2. Therefore, at the point indicated by the numeral 88, the CARRY line 36 may be discharged and inverter 34 begins to produce a positive voltage to turn on the FET 30. After the phase separation time, the $\phi 2$ signal begins to rise to turn on FET 28, thereby transmitting the binary state originally entered through FET 44 and inverted through inverter 26 into the portion of cell 10 which includes the inverters 18 and 20.

During time T1, either the decrementing conductor 54 or the incrementing conductor 50 may receive a control signal from an external source to turn on FETs 48 or 52. Thus, the signal appearing at the input of inverter 26 or the signal appearing at the output of inverter 26 is transmitted to the gate element of FET 46 in the CARRY line 36. If the particular signal transmitted by either FET 48 or 52 is high, FET 46 will conduct so that the CARRY line 36 will discharge up to the first non-conductive higher order FET in the CARRY line 36. Thus, if NET 90 associated with cell 10 is non-conductive, the conductive state of FET 46 will permit discharge of the CARRY conductor 36 between the FET 90 and through FETs 56 or 58 into the sink provided by the low value of $\phi 1$ during the state time T1.

When $\phi 1$ begins to go high during time T1, as indicated by the reference numeral 92 of FIG. 2, FETs 56 and 58 become non-conductive, FET 60 begins to conduct to reapply the charge to the CARRY conductor 36, thus turning off FET 30, and a positive signal is applied to the SAVE conductor 32 to render FETs 22 and 24 conductive to permit circulation of the signal just previously produced at the output of inverter 26. Either one of the transistors 48 or 52 may remain on inasmuch as the increment conductor 50 and decrement conductor 54 may remain positive during the entire state time T1.

At the beginning of state time T2, indicated by the reference numeral 94 of FIG. 2, the output control conductor 76 receives a high signal to turn on FET 66. As $\phi 2$ begins to go to its high state, the $\phi 2$ conductor 68 goes high to turn on FET 72 so that the positive D.C. voltage on the conductor 74 will pass through FET 72 to apply a positive pre-charge signal to the bus 38. Thus, irrespective of the values appearing on any of the buses, the bus 38 and all remaining buses are pre-charged to their high value representing a binary "1" during $\phi 2$. It will be noted that the high $\phi 2$ will also render FET 28 conductive but since the CARRY line 36 has previously been charged, the inverter 34 will produce an inhibiting output to turn off FET 30.

During state time T2, the FET 66 is on but conduction cannot take place until the signal on the $\phi 2$ conductor 68 drops to its low state to provide a current sink as indicated by the reference numeral 96 in FIG. 2. At this point, the bus 38 may discharge if FET 64 has been rendered conductive by a positive output of the inverter 18. Therefore, if a binary "1" was loaded into the cell 10 during time T0 through the input FET 44 and inverted to a "0" by inverter 26 and then circulated during time T1, then inverter 18 would produce a binary "1" output which, during a low $\phi 2$ during time T2, will discharge the bus 38 through FETs 64 and 66 to the low $\phi 2$ conductor, thereby replacing the binary "0" the bus 38.

Cells 12, 14 and 16, which are identical with cell 10 but which illustrate the FETs in a simplified form, operate identically with the operation of the described cell 10. Thus, if FET 46 in cell 10 is turned on by a positive signal through either FET 48 or 52, the CARRY line 36 will discharge up to the FET 90 of cell 12. This enables the inverter 100 to produce a positive output signal that will provide circulation of the binary number applied to the cell 12 from bus 102, thereby permitting cell 12 to change the number in the bus 102. Similarly, when FET 90 becomes conductive, the CARRY line 36 may discharge up to the next non-conductive FET in the CARRY line, which may be FET 104 associated with cell 14, or 106 associated with cell 16. The discharge of the CARRY conductor 36 permits a positive output from the input inverter, such as inverter 34 in cell 10 or inverter 100 in cell 12, thereby permitting the binary number originally introduced by the respective buses to circulate through three inverters, such as inverters 18, 20 and 26 of cell 10, to thereby change to the opposite binary state. Thereafter, during state time T2, the new binary number may be re-applied to the respective buses by selectively applying a positive control signal to conductor 76.

The overall operation of the incrementer/decrementer circuit is therefore to first examine the conductivity of the FETs 46, 90, 104 and 106 for conductivity produced by a positive signal to either the increment control line 50 or the decrement control line 54. If the increment control line 50 is thus activated, each cell carrying a "1" that passes the test plus the next cell carrying a "0", will be toggled, thereby incrementing the number stored in the circuitry. For example, if FETs 46 and 90 are conductive but FET 104 is non-conductive, and if only the cells 10 and 12 carry a "1", all three cells 10, 12 and 14 will toggle to change from the binary number "0011" to "0100".

If, on the other hand, the signal is applied to the decrement control line 54, the circuitry will test for a sequence of binary "0's" beginning with the least significant digit cell 10 and will toggle all bits that pass this test plus the next bit. Thus, if cells 10, 12, 14 and 16 carry a binary "1000", they will be toggled down to a "0111" by decrementing.

It will be noted that the four-bus incrementer/decrementer provides for an overflow in the event that all cells are fully loaded and are thereafter incremented. If all FETs in series along the CARRY line 36 are conductive, and an additional increment signal is applied to conductor 50, an overflow or CARRY pulse will be produced from the inverter 108 in the CARRY line 36 and to the left of cell 16. This signal may be used as desired.

Having thus described my invention, what is claimed is:

1. A digital incrementing/decrementing circuitry for receiving a binary number from a data bus, selectively incrementing and decrementing the number, and re-applying the new number to the data bus, said circuitry comprising:
    a plurality of storage cells, one cell of said plurality being coupled to each conductor in the data bus, each cell in said plurality having a closed data circulation path containing an odd number of signal inverters and at least one signal gating means;
    a first conductor intercoupling each of said plurality of cells, the end of said first conductor adjacent the least significant digit cell of said plurality of storage cells being selectively discharged at first predetermined times;
    pre-charging means for charging said first conductor with a positive voltage at second predetermined times;
    circuitry coupling said first conductor with the signal gating means in each cell of said plurality for enabling said gating means upon the selective discharging of said first conductor;
    a plurality of switching means interposed in said first conductor, one of said switching means being associated with each of said plurality of storage cells, each switching means in said plurality being rendered conductive by the simultaneous application of a selectively applied incrementing signal and a first polarity signal in said cell and by the simultaneous application of a selectively applied decrementing signal and a first polarity signal in a signal inverted section of said cell;
    loading means operative during said second predetermined time for loading data from each conductor in said data bus into its respective cell; and
    re-loading means for applying the binary number from said plurality of storage cells into said data bus.

2. The circuitry claimed in claim 1 wherein said first conductor is selectively discharged by the application of an incrementing signal and a decrementing signal.

3. The circuitry claimed in claim 1 wherein each of said storage cells include first, second, and third inverters connected to series in a ring configuration, and wherein said loading means is coupled to load the signal from a bus conductor into the input of said first inverter and into the input of said third inverter.

4. The circuitry claimed in claim 3 wherein said re-loading means includes switching means rendered conductive by a positive output signal from said second inverter and a reloading control signal selectively applied during said second predetermined time for discharging the positive voltage applied to said data bus by said pre-charging means.

5. The circuitry claimed in claim 4 wherein each of said storage cells include a data holding circuit comprising a transistor switch interconnecting the output of said second inverter with the input of said first inverter, said switch being turned on by the application of a "SAVE" signal during times when said loading means is inoperative.

6. The circuitry claimed in claim 5 wherein each of said plurality of switching means is rendered conductive to permit discharge of said first conductor to the next non-conductive higher order one of said switching means by the application of an externally applied incrementing signal and a positive signal input to said third inverter, and by the application of an externally applied decrementing signal and a positive signal output from said third inverter.

7. The circuitry claimed in claim 6 wherein each storage cell in said plurality includes first and second signal gating transistors in series between the output of said third inverter and the input of said first inverter, said first transistor being rendered conductive by the discharge of said first conductor, said second transistor conductive during said first predetermined time.

* * * * *